United States Patent [19]

Petit et al.

[11] Patent Number: 4,703,394
[45] Date of Patent: Oct. 27, 1987

[54] SYSTEM FOR INTERCONNECTING ORTHOGONALLY DISPOSED PRINTED CIRCUIT BOARDS AND SWITCHING NETWORKS EMPLOYING SAME

[75] Inventors: André Petit, Longpont Sur Orge; Etienne Pénicaud, Chaville; Gérard Le Coz, Saint Cheron; Daniel Jamet, Nozay, all of France

[73] Assignee: Alcatel, Paris, France

[21] Appl. No.: 922,641

[22] Filed: Oct. 24, 1986

[30] Foreign Application Priority Data

Oct. 25, 1985 [FR] France ................................ 85 15893

[51] Int. Cl.⁴ ............................................. H05K 1/14
[52] U.S. Cl. .................................... 361/413; 361/412; 361/416; 439/65; 439/544
[58] Field of Search ....................... 361/413, 412, 416; 339/177

[56] References Cited

U.S. PATENT DOCUMENTS

| | | | |
|---|---|---|---|
| 3,963,301 | 6/1976 | Stark | 361/413 X |
| 4,237,546 | 12/1980 | Wells | 361/413 X |
| 4,472,765 | 9/1984 | Hughes | 361/413 |
| 4,550,362 | 10/1985 | Reimer | 361/413 X |
| 4,575,780 | 3/1986 | Brombal et al. | 361/413 |
| 4,628,410 | 12/1986 | Goodman et al. | 361/413 |

FOREIGN PATENT DOCUMENTS 2214678 9/1973 Fed. Rep. of Germany .
2025736 1/1980 United Kingdom .

Primary Examiner—R. R. Kucia
Attorney, Agent, or Firm—Sughrue, Mion, Zinn, Macpeak, and Seas

[57] ABSTRACT

A system for interconnecting orthogonally disposed printed circuit boards in first and second stacks comprises first contact members on facing edges of the boards of the two stacks used to interconnect the boards. A mother board is disposed perpendicular to and between the two stacks of boards. Second contact members are disposed on the same facing edges of the boards as the first contact members. They define with the first contact members a series of first multiway plug-in connectors along the respective edge of each board in the first stack and a series of second multiway plug-in connectors along the respective edge of each board in the second stack. The mother board comprises a distribution network in the form of an array of conductive tracks assigned to distributing signals to the boards. The mother board also carries connecting contact members and distribution contact members connected to the distribution network. They are disposed transversely to the mother board and define on one side of it a set of third multiway plug-in connectors adapted to have the first connectors plugged into them. On the other side of the mother board they define a set of fourth multiway plug-in connectors adapted to have the second connectors plugged into them. These interconnect the first contact members of corresponding first and second connectors via the connecting contact members. They also connect the second contact members of each board to the distribution network via the distribution contact members.

11 Claims, 6 Drawing Figures

SYSTEM FOR INTERCONNECTING ORTHOGONALLY DISPOSED PRINTED CIRCUIT BOARDS AND SWITCHING NETWORKS EMPLOYING SAME

BACKGROUND OF THE INVENTION

1. Field of the invention

The present invention concerns a system for interconnecting orthogonally disposed printed circuit boards forming part of respective first and second stacks. It also concerns switching networks using cascaded selection stages employing one or more such interconnecting systems, such switching networks being employed in telecommunication networks and in particular in telephone networks used to transmit digital data at high bit rates, for example 45 Mbit/s.

2. Description of the prior art

One method of interconnecting orthoganally disposed printed circuit boards is described in French Pat. No. 2 109 246.

It is used to interconnect successive selection stages of switching networks, in particular of networks with three cascaded selection stages each defined by a stack of appropriately equipped printed circuit boards.

According to this document, for the purpose of interconnecting orthogonolly disposed printed circuit boards forming parts of stacks defining two successive selection stages in a switching network, there is provision for placing the inputs and outputs of each board on a common edge in the respective stack. These edges in the two stacks are in face-to-face relationship and the boards of one stack are disposed orthogonally to the boards in the other stack. The selection stages are interconnected by a simple plug-in action by having contact members connected to the various inputs and outputs of each of the boards in the two stacks cooperate with each other. These contact members are hermaphroditic members or may be male contact members in the case of the boards in one stack and female contact members in the case of the boards in the other stack. This interconnection method makes it possible to eliminate all wiring between the boards in the two stacks.

In the specific embodiments described in this prior art document the contact members are mounted in pairs and those in each pair are on opposite sides of the board concerned. Interconnecting successive selection stages using this interconnection method necessitates adopting the same modular spacing between boards and contact members. Thus to the degree that the thickness of the boards is less than the distance between two contact members on the same side, an appropriate make-up member is attached to one side of the boards. As applied to printed circuit boards this technique is highly impractical and makes it doubtful whether this interconnection method can be implemented on an industrial basis. It would also seem that the electrical connections made and the mechanical strength of the connections at the level of the contact members are somewhat unreliable.

According to the same document, in a switching network with three cascaded selection stages using this interconnection method between two successive stages, the boards of the two terminal selection stages are disposed parallel to each other and perpendicular to the boards of the intermediate selection stage. The boards of the two terminal stages are advantageously L-shaped so as to carry on one and the same edge the contact members for connection to the boards of the intermediate stage and connectors for connecting the boards of the terminal stages with the input circuits (terminals) and the output circuits (junctors) to be connected selectively to each other. In this way the connectors are on the outside of the intermediate selection stage and make it possible to utilize a "backplane" type distribution frame.

An object of the present invention is to provide a method of interconnecting orthogonal boards that totally eliminates any wiring between the boards and further makes it possible simultaneously to achieve distribution of signals to the various boards, all this compatibly with known requirements in terms of the reliability of the connections made and industrial manufacture of the interconnecting system and the switching networks using it.

SUMMARY OF THE INVENTION

In one aspect, the present invention consists in a system for interconnecting orthogonally disposed printed circuit boards in respective first and second stacks, comprising first contact members disposed on facing edges of said boards in said two stacks assigned to connections between said boards, a mother board disposed perpendicular to said boards between said two stacks, and second contact members disposed on the same facing edges of said boards as said first contact members and defining with said first contact members a series of first multiway plug-in connectors along the respective edge of each board of said first stack and a series of second multiway plug-in connectors along the respective edge of each board of said second stack, wherein said mother board comprises a distribution network in the form of an array of conductive tracks assigned to distributing signals to said boards and third or connecting contact members and fourth or distribution contact members connected to said distribution network, disposed transversely to said mother board and defining on one side thereof a set of third multiway plug-in connectors adapted to have said first connectors plugged into them and on the other side thereof a set of fourth multiway plug-in connectors adapted to have said second connectors plugged into them and interconnecting said first contact members of corresponding first and second connectors via said connecting contact members and connecting said second contact members of each board to said distribution network via said distribution contact members.

In another aspect, the invention consists in a matrix switching network for bidirectional circuits comprising three cascaded selection stages of which the center stage is symmetrical and each of which is defined by a stack of switching circuit boards implementing a system as defined in the preceding paragraph, wherein there are four contact members assigned to the connections between said orthogonal boards arranged at the corners of a square parallel to said mother board and having, for said first and second connectors, two sides parallel to said boards, and wherein each board of said first stack is assigned to said first and third selection stages and carries, in addition to said third multiway connectors, bidirectional input/output coaxial connectors for as many pairs of coaxial cables as there are first multiway connectors on the edges of the respective board adjacent that carrying said first connectors.

In a third aspect, the invention consists in a matrix switching network for bidirectional circuits comprising cascaded selection stages each defined by a stack of switching circuit boards implementing a system as defined in the preceding paragraph but one, wherein said interconnecting system is employed between switching circuit boards constituting said boards of said first stack and forming part of terminals stages of said network and interface boards constituting said boards of said second stack and handling bidirectional circuits to which are assigned said switching circuit boards constituting said borads of said first stack.

The connectors carried by the interface boards advantageously comprise hybrid connectors, with pins and coaxial contacts, and the third and fourth multiway connectors carried by the mother board of the interconnecting system are embodied in complementary hybrid connectors with pins and coaxial contacts, mounted on the facing side of the interface boards and having their pins other than those defining said connecting and distribution contact members removed, the coaxial contacts on said mother board being connected to the bidirectional circuits.

The characteristics and advantages of the present invention will emerge more clearly from the following description given by way of example only and with reference to the appended drawings.

BRIEF DESCRIPTION OF THE DRAWINGS

FIG. 5 is a view in the direction of the arrow V in FIG. 6, with some parts shown in cross-section.

DESCRIPTION OF THE PREFERRED EMBODIMENTS

Figure 1:
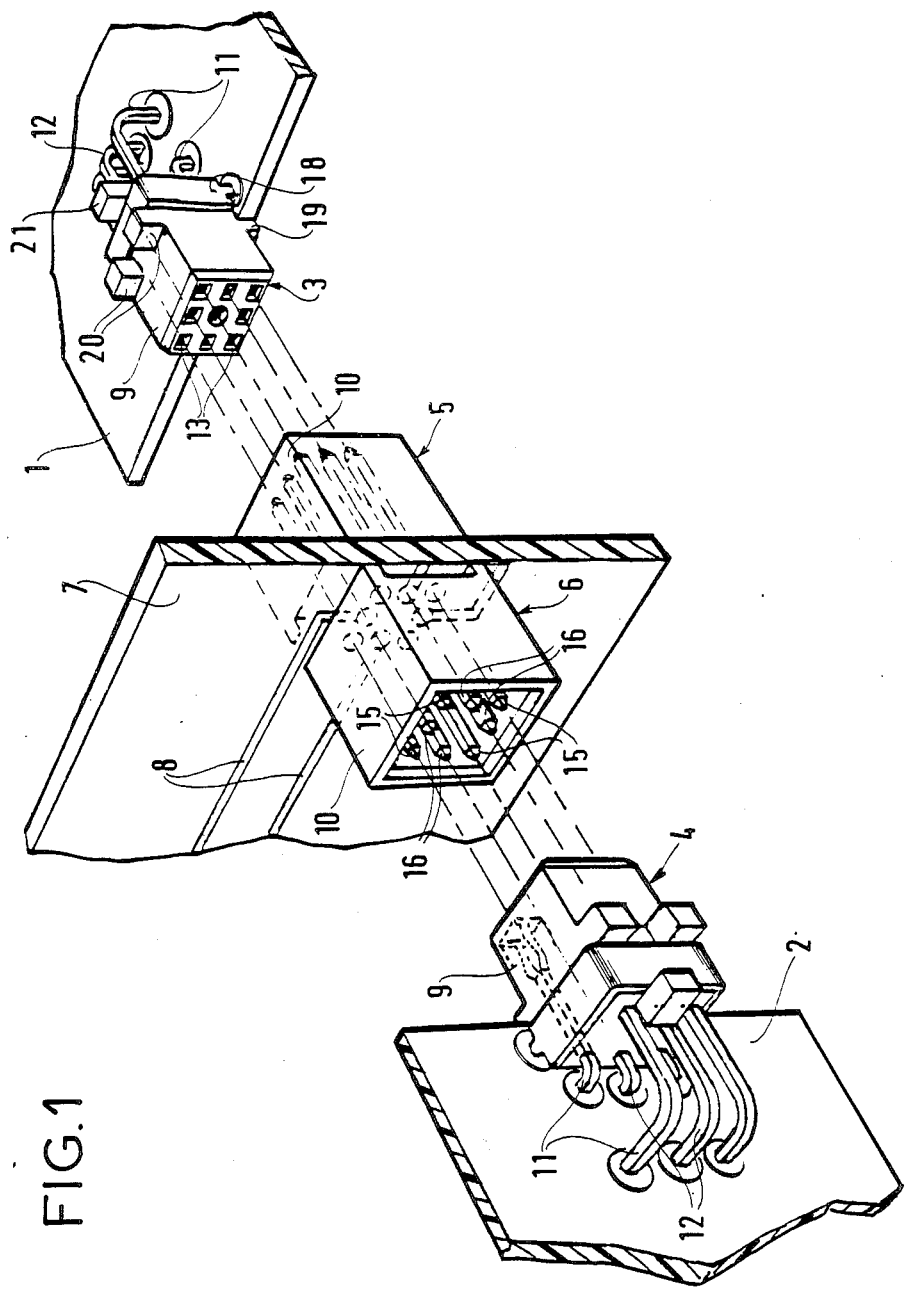
FIG. 1 shows an elementary part of a system in accordance with the invention for interconnecting orthogonally disposed printed circuit boards.

FIG. 1 is an exploded view in perspective of an elementary part of an interconnecting system in accordance with the invention. This elementary part relates to two orthogonally disposed printed circuit boards to be interconnected in areas in face-to-face relationship, of which two boards one board 1 is horizontal whereas the other board 2 is vertical; they belong to two stacks of boards, one vertical and the other horizontal.

This elementary part of the interconnection system comprises a first multiway connector 3 and a second multiway connector 4 mounted on respective facing edges of the boards 1 and 2 in their areas in face-to-face relationship and a third multiway connector 5 and a fourth multiway connector 6 mounted on respective opposite sides of an additional or interface printed circuit board 7. The mother board 7 also has an array of conducting tracks 8 on one or both sides.

The first and second multiway connectors are identical to each other. Each has a collar 9 forming the body of the connector, in the general shape of a square cross-section parallelepiped, and is positioned on one side of the board concerned so as to project from the edge of the board. The third and fourth multiway connectors are also identical to each other. They are aligned with each other transveresly to the mother board, being disposed one on each side thereof. Each of the connectors 5 and 6 has a square cross-section parallelepipedal collar 10 into which either of the collars 9 may be plugged.

This elementary part of the interconnection system is designed to provide a bidirectional connection with two wires for each direction between the boards 1 and 2. To this end the first and second multiway connectors 3 and 4 each comprise four individual first contact members 11. Inside the connector the four contact members 11 are insulated from each other and, as seen in cross-section lie at the four corners of a square. Each of these connectors also has two additional second contact members 12.

Inside the connector these second contact members are insulated from each other and from the four first members; as seen in cross-section they are at the centers of two opposite sides of the square defined by the first members, the opposite sides in question being those parallel to the board carrying the connector.

The six contact members 11 and 12 are partially mounted in the collar 9. This has eight identical housings 13 inside it, six of these being force-fitted with the aforementioned six contact members 11 and 12, which they hold in position and insulate, the other two at the centers of the other two opposite sides of the square remaining empty. In the collar 9 the ends of the contact members are slightly set back relative to the front surface of the connector; inside the collar each of these ends terminates in two branches for pressurized contact with an individual pin, as shown schematically for one of the contact members, their housings constituting on the front surface of the connector access ways serving as guides on plugging in the pins.

The ends of the six contact members 11 and 12 externally of the collar 9 are bent are right-angles and connected to the board 1 or 2, as appropriate. These ends are disposed in two rows parallel to the edge of the board 1 or 2 and are inserted and soldered into plated-through holes provided for this purpose.

In corresponding relationship with one or other of the connectors 3 and 4 each of the connectors 5 and 6 has four third contact members 15 and four fourth contact members 16. These contact members 15 and 16 are individual pins common to the two connectors and insulated from each other. The pins forming the third contact members of both the connectors 5 and 6 simply pass through the connectors and the mother board 7; those forming the fourth contact members of the connectors also pass through the connectors and the mother board but are also connected to the array of conductive tracks 8 on the mother board 7.

In each of the connectors 5 and 6 the relative disposition of the third contact members 15 is identical to that of the first contact members of the connector 3 or 4; each plugs in between the two branches of the corresponding first contact member of the connector 3 or 4.

Seen in cross-section, the fourth contact members 16 are at the centers of the sides of the square defined by the third members; an opposed pair of them plug in between the two branches of the second contact members of one of the connectors 3 and 4, with the other two plugged in between the branches of the second contact members of the other of the connectors 3 and 4.

The pins of the connectors 5 and 6 are force-fitted into holes in the mother board through which they pass, these holes being plated-through in the case of those for the pins forming the fourth contact members, and also interlock force-fit fashion with each of the collars 10 through which they also pass.

In the connectors 5 and 6, the collars 10 surround the end part of the pins and so protect them and serve as guides when the connectors 3 and 4 are plugged in through the open front surfaces of the connectors 5 and 6. The symmetry of the two connectors 5 and 6 relative to the mother board 7 makes it possible to achieve the previously described connection required between their contact members and those of the connectors 3 and 4.

To locate the collars 9 of the connectors 3 and 4 on the boards 1 and 2 there is provided on each collar 9 a rib 19 projecting from the side that bears on the board 1 or 2, the rib 19 itself bearing against the edge of the board.

To procure correct and complete plugging of one of the connectors 3 and 4 into one of the connectors 5 and 6 there are provided on the side of the collar 9 opposite the side carrying the rib 19 two lugs 20 serving as an abutment member for the collar 10 on completion of the plugging in action. An additional lug 21 on the same side defines between it and the lugs 20 a housing for an optional retaining clamp such as the clamp 18 shown in FIG. 1, for example.

This elementary part constitutes one interconnection module. It provides a bidirectional connection between the boards 1 and 2 and also, by virtue of the contact members at the centers of the sides of the square arrangement shown, distribution of power supply, clock and control signals and sampling of test signals on one or both sides of the boards 1 and 2 via the mother board 7.

Figure 2:
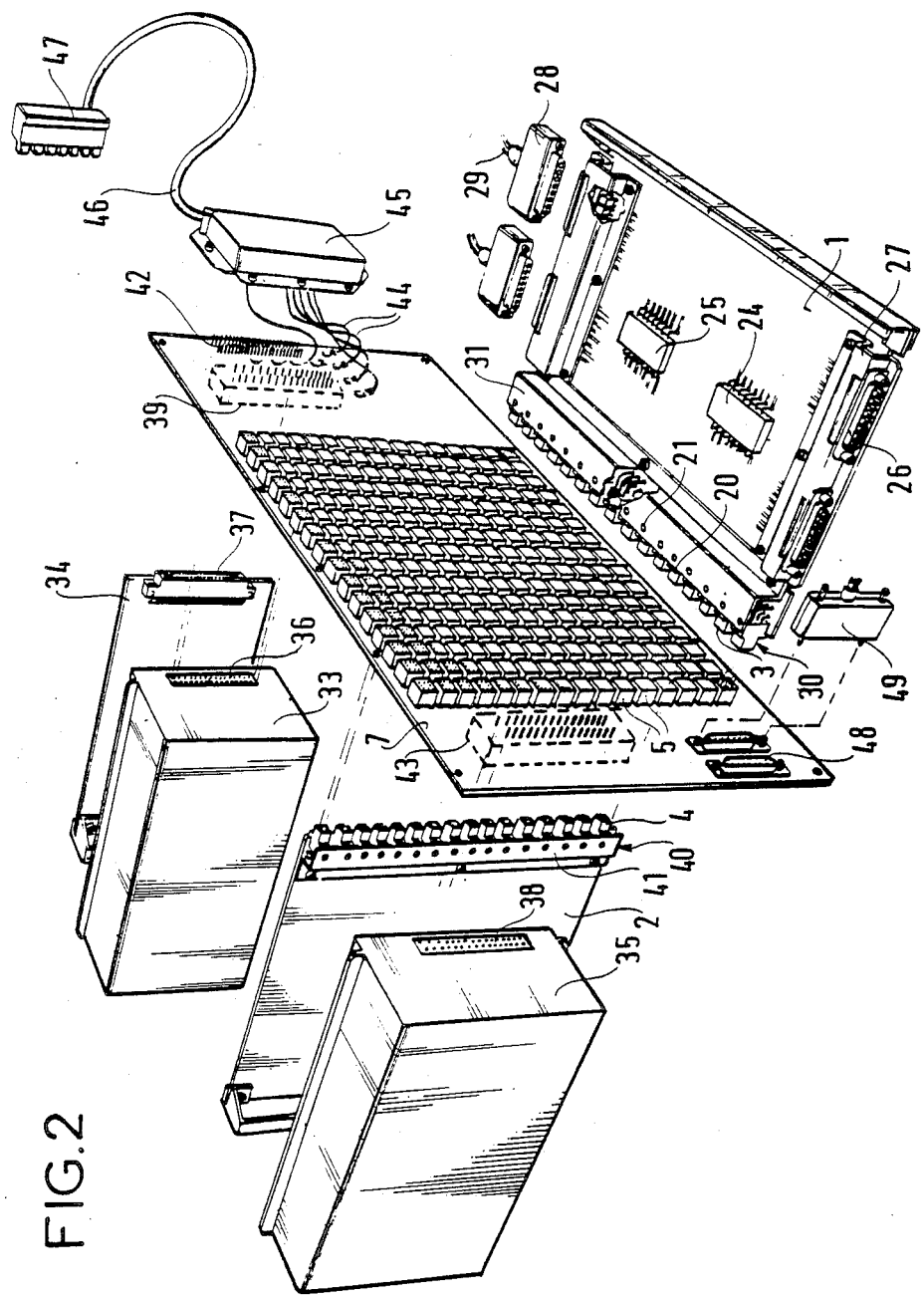
FIG. 2 shows an interconnecting system based on FIG. 1, with provision for implementing a switching network with three cascaded selection stages.

FIG. 2 is an exploded view showing the layout of a switching network between incoming circuits and outgoing circuits, comprising 256 bidirectional circuits in the example under consideration. The network is of the matrix type organized in cascaded selection stages. In this case of distributing 256 bidirectional circuits, it comprises three selection stages each of which is a 16×16 matrix. Each selection stage is implemented in the form of a stack of printed circuit boards each carrying a connection circuit with a matrix switching circuit inserted in the connection circuit defining possible transmission paths on the board in the case of the boards of the two terminal stages, between inputs/outputs of circuits on this board and inputs/outputs for interconnecting boards of two adjacent stages and, in the case of the boards of the intermediate stage, between inputs-/outputs for interconnecting boards of two adjacent selection stages. This switching network utilizes an interconnection system made up of elementary parts identical to that of FIG. 1 to interconnect boards of two adjacent selection stages.

Referring to FIG. 2, the switching network assigned to the 256 bidirectional circuits is symmetrical relative to the central selection stage. It comprises a first selection stage consisting of a first stack of 16 horizontal boards like the single horizontal board 1 shown, a second selection stage consisting of a second stack of 16 vertical boards like the single vertical board 2 shown, and a third selection stage consisting of the stack of horizontal boards like the board 1. The horizontal boards are identical to each other, each forming part of the first selection stage and part of the third selection stage; the vertical boards are also identical to each other.

The horizontal board 1 shown carries two switching circuits 24 and 25 respectively assigned to the first selection stage and the third selection stage. The vertical board 2 shown carries only one switching circuit (not visible) assigned to the second selection stage.

On the horizontal board 1 shown for connectors 26 each fitted with eight coaxial contacts connected to the connection circuit (not shown) define 16 bidirectional input/output connections for 16 of the 256 bidirectional circuits.

The connectors 26 are mounted on two opposite edges of the board 1 other than that facing the vertical boards, with two connectors side by side on each edge. They are fixed to each edge by a U-shaped metal rail 27 with upstanding edges which supports them and serves as a stiffener. Four pugs 28 terminating four cables 29 connecting eight coaxial pairs for the 16 bidirectional circuits provide the connections by electrical contact between the 16 bidirectional circuits and the bidirectional input/output connections defined by the connectors 26 on the board 1.

The edge of the board 1 facing the vertical boards carries a strip 30 of first multiway connectors 3 identical to the first multiway connector 3 in FIG. 1. The strip 30 consists of a series of 16 connectors 3 held in regularly spaced alignment. A bracket 31, the profile of which has the shape of two superposed uppercase letters L of which one is reversed, effects this alignment and holds the connectors 3 against the board 1. One of the horizontal legs of this bracket 51 bears on the collars of the connectors 3, has openings into which are inserted the lugs 21 of the series of connectors 3 and is held with its edge against the lugs 20. The other horizontal leg of this bracket bears on and is fixed to the board 1.

The vertical board 2 carries on its edge facing the horizontal boards another strip 40 of second multiway connectors 4 identical to the second multiway connectors 4 in FIG. 1. The strip 40 is identical to the strip 30; it comprises a series of 16 aligned and regularly spaced connectors 4 secured by a bracket 41 identical to the bracket 31.

The distance between the connectors 3 in the strip 30 is equal to the distance between the vertical boards; the distance between the connectors 4 in the strip 40 is equal to the distance between the horizontal boards. These two distances are the same.

In this switching network, a mother board 7 analogous to the mother board 7 in FIG. 1 interconnects the orthogonally disposed horizontal and vertical boards of the two stacks which are individually equipped with their strips of connectors. The mother board 7 carries on the side facing the stack of horizontal boards a set of third multiway connectors 5 identical to the connector 5 in FIG. 1. It carries on its other side, facing the stack of vertical boards, a set of fourth multiway connectors that are not visible but which are all identical to the connector 6 in Figure 1; this set of fourth connectors is identical to the set of third connectors 5.

In the set of connectors 5 of the individual connectors are arranged in a matrix with 16 rows and 16 columns, the distance between them in each row or column being the same as that between the individual connectors 3 or 4 in their respective strip 30 or 40.

This switching network further comprises a power supply converter 33, a test and signalling circuit board 34 and a back-up converter 35. The converter 33 and the test and signalling circuit board 34 are disposed on one side of the stack of vertical boards 2 with the back-up converter 35 on the other side of this stack. They carry facing the mother board 7 a male or female connector, respectively 36, 37 and 38, that plugs into a complementary connector 39, 42 or 43 carried by the mother board. These connectors are of a known type. The connectors carried by the mother board 7 have their pins force-fitted through the mother board. The two connectors 39 and 42 assigned to the converter 33 and to the test and signalling circuit board 34, which are side by side, also have their pins connected on the side of the stack of horizontal boards 1 to output connections 44 of a filter unit 45. The filter unit 45 is in turn connected to a general power supply (not shown) by a power supply and alarm cable 46 terminated with a plug 47.

A set of additional connectors 48 in the vicinity of the edge of the mother board opposite that carrying the connectors 39 and 42 serves to apply clock and control signals to the board. The set of connectors 48 receives these signals from complementary connectors 49 terminating links transmitting these signals. The power supplies and the various clock and control signals received by the mother board are distributed to each of the horizontal and vertical boards in the two stacks. Such distribution is achieved by the network of conductive tracks carried by the mother board, as in FIG. 7 but not shown in FIG. 2 to avoid overcomplicating the diagram, and by the fourth contact members of the connectors carried by the mother board which define 32 input/output points for distribution of distinct signals along the edge of each of the horizontal and vertical boards 1 and 2.

Figure 3:
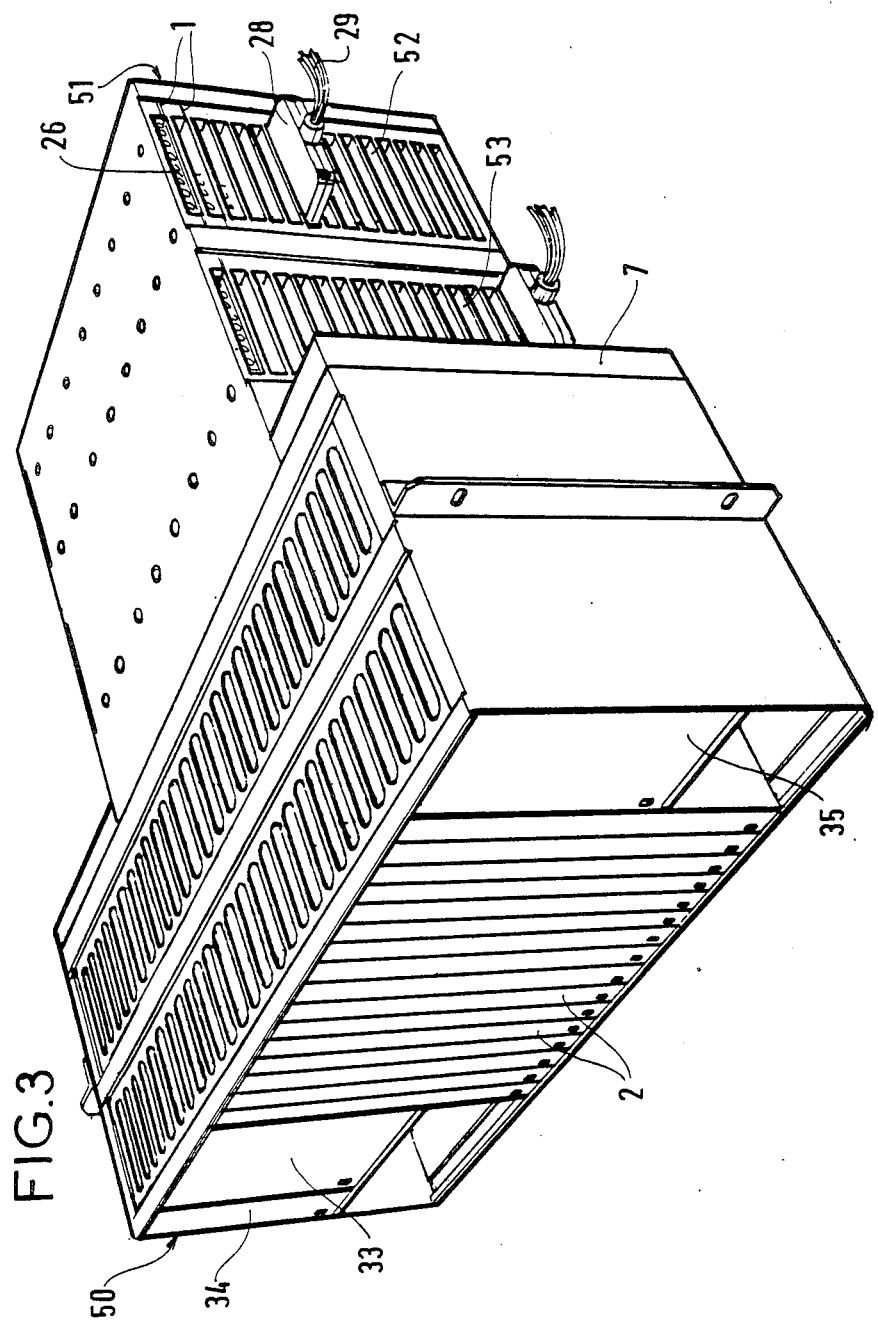
FIG. 3 shows the FIG. 2 arrangement mounted in a shelf.

FIG. 3 shows the switching network as in FIG. 2 mounted in a shelf. The shelf dimensions are compatible with CCITT standards. The parts mounted in it are designated by the same reference numbers as previously.

The shelf comprises a so-called front parts 50 having a central compartment accommodating the 16 vertical boards 2. Lateral compartments in this front part accommodate the power supply converter 33 and the test and signalling circuit board 34, separately to each other, and the back-up power supply converter 35. A so-called rear part 51 of the shelf, disposed to the rear of the central compartment of the front part, receives the 16 horizontal boards 1.

The two parts 50 and 51 are separated by the mother board 7 which spans the complete depth of the front part 50, interconnects the vertical and horizontal boards and distributes signals to the boards.

In the rear part 51 the two lateral sides of the shelf each feature 16 pairs of openings 52, 53 in corresponding relationship to the 16 horizontal boards 1, as can be seen on the only lateral side visible in this figure. It is through these openings that the plugs 28 terminating the connecting cables 29 of the 256 bidirection circuits are connected to the horizontal boards. These plugs therefore immobilize the horizontal boards in the rear part; each may be secured to the corresponding connector 26 carried by a horizontal board by means of screws. On the back of the front part 50 the lateral parts of the mother board which project relative to the rear part 51 receive the output connections of the filter unit 45 and connectors such as the connector 49 shown in FIG. 2 but not visible in FIG. 3.

A shelf of this kind constitutes one of the items of equipment fitted into a switching rack which also comprises, in the case of a network handling 256 bidirectional circuits, eight other shelves each with 16 interface boards each processing two bidirectional circuits. These eight other, so-called interface shelves for the 256 circuits are therefore connected to the switching shelf shown in FIG. 3 by 64 cables each comprising eight coaxial pairs, like the cable 29, all of the same length.

Figure 4:
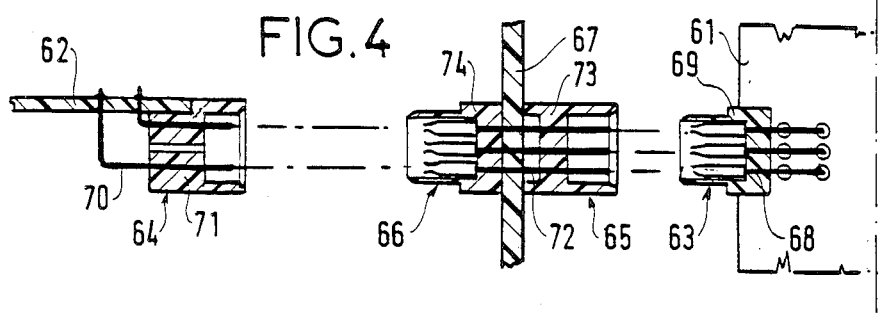
FIG. 4 shows a modification to the elementary part of a system for interconnecting orthogonally disposed printed circuit boards as shown in FIG. 1.

FIG. 4 shows an elementary interconnecting part disposed between a horizontal board 61 and a vertical board 62. This elementary part constitutes a variation on that shown in perspective in FIG. 1.

This elementary interconnection part also defines four multiway connectors 63, 64, 65 and 66; the two connectors 63 and 64 are carried by the horizontal board 61 and the vertical board 62, respectively, being mounted on their respective facing edges; the other two connectors 65 and 66 are carried by a mother board 67, one on each side thereof.

In FIG. 4 the connectors 63 and 64 on the horizontal and vertical boards are different, one being a female type connector and the other a male type connector.

The same applies to the connectors 65 and 66 into which they respectively plug and which are carried by the mother board.

The multiway connector 63 carried by the horizontal board is of the female type. It has six contact members 68 having elbow-bend first ends arranged in two rows parallel to the edge of the board 61 and connected to the board 61. The second ends of these contact members are inside an individual collar 69 which surrounds them, defining within it six pairs of pressure contacts for individual pins of which four, as seen in cross-section, are arranged at the corners of a square with the other two at the centers of two opposite sides of the square parallel to the board 61. This connector 63 is similar to the connector 3 in FIG. 1.

A multiway connector 64 carried by the vertical board 62 is of the male type. It has six contact members 71 having elbow-bend first ends connected to the board 62 and arranged in two rows parallel to its edge. The second ends of these contact members form pins inside a collar protecting them on two opposite sides and serving as a guide for plugging in the connector 66. In the connector 64 four of the pins, as shown in cross-section, are at the corners of a square identical to that defined in the connector 63, the other two being at the centers of two opposte sides of the square parallel to the board 62.

The multiway connector 65 carried by the side of the mother board 67 facing the multiway connector 63 is of the male type. The multiway connector 66 carried by the side of the mother board 67 facing the multiway connector 64 is of the female type. Each of these connectors has eight contact members 72 passing through the mother board. They define within the connector 65 eight pins in an individual collar 73 through which they pass and into which they are force-fitted and in the connector 66 a set of eight pairs of pressure contact branches protected on two sides by a collar 74. In the connectors 55 and 56 the contact members are, as seen in cross-section, at the corners of a square identical to that defined in the connectors 63 and 64 and at the centers of the sides of this square.

The connectors 65 and 66 may comprise a ninth contact member disposed, as seen in cross-section, at the center of the square; the connectors 63 and/or 64 may also comprise an additional, corresponding contact member.

From the functional point of view this elementary interconnection part is identical to that of FIG. 1. It makes the connections between the boards 61 and 62 through the four contact members at the corners of the squares; the other contact members distribute signals to the board 61 and to the board 62, and possibly carry output signals from the boards, by means of an array of conductive tracks (not shown) on the mother board connected to the contact members at the centers of the sides of the square.

Figure 5:
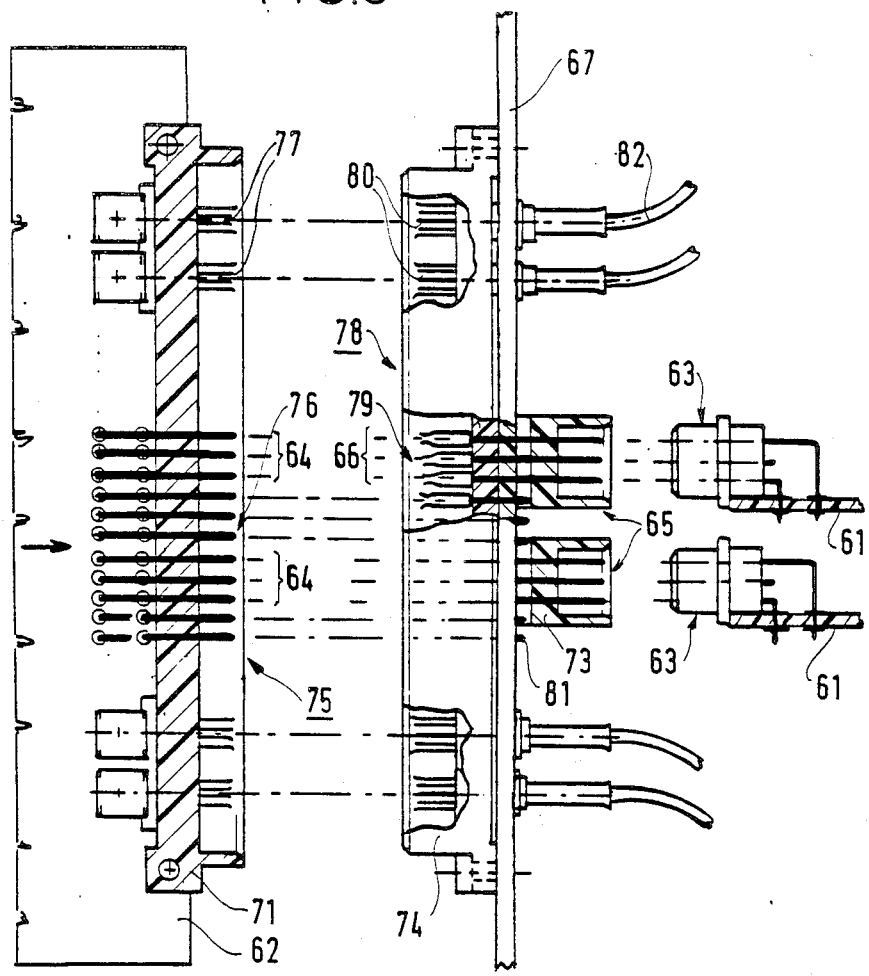
FIGS. 5 and 6 are respectively a side view and a perspective view of an interconnecting system based on FIG. 4 and on the adaptation of existing connectors, this interconnection system providing for the implementation of a terminal module in a switching network.
Figure 6:
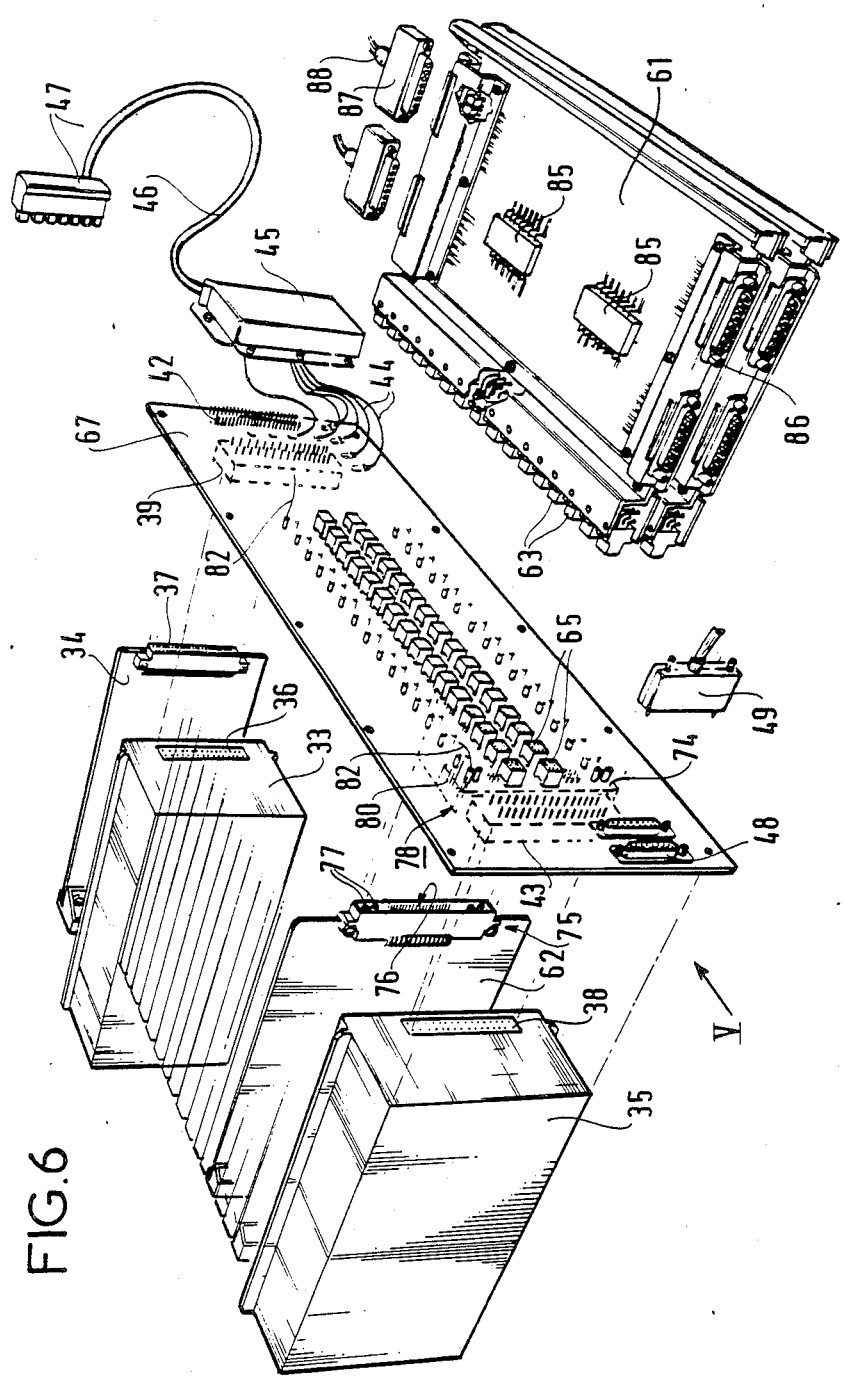

FIGS. 5 and 6 show a system for interconnecting orthogonally disposed boards designated by the same reference numbers 61 and 62 as before. This interconnecting system uses for the most part the same component parts as FIG. 4, for which the same reference numbers are used.

The boards 61 and 62 form two stacks, with a limited number of horizontal boards 61, two in this instance; there are 16 vertical boards.

Given these conditions, the connectors 64, 65 and 66 are advantageously defined within known type connectors appropriately adapted.

Thus each of the vertical boards 62 carries a hybrid male type connector 75 which features in the known way in the central part of its collar 71 housings for pins 76 arranged in three parallel rows. At each end of its collar it has two coaxial contacts 77 disposed in housings specially provided in the collar and connected to the board 62. The only modification to the connector 75 needed to define the aforementioned connector 64 might consist in fitting pins only in the housings of the two end parallel rows in the central part of its collar so as to form rows of pins to which there correspond two rows of plated-through holes along the edge of the board 62, in order to connect them.

The mother board 67 carries as many hybrid connectors 78 as there are vertical boards, the connectors 78 each being complementary to the connectors 75 and separated by the same distance as separates the vertical boards in their stack. Each connector 78 mounted on the side of the mother board 67 facing the vertical boards is of the female type. It has in the central part of its collar 74 three rows of pressure-type female contacts terminating a set of pins 79 which are force-fitted through the mother board. At each end of its collar there are two coaxial contacts 80 corresponding to the coaxial contacts 77.

On the side of the mother board facing the two horizontal boards are defined the two connectors 65 assigned in each connector 78 to the two horizontal boards. To modify each connector 75 as necessary the pins other than the eight or nine pins forming part of one or the other of the two connectors 65 are cut to form short contacts 81. The individual collars 73 force-fitted to each of the two groups of pins retained serve to "materialize" the connectors 65 and protect their pins. On the same side of the mother board the coaxial contacts 80 are connected to coaxial links 82 such as those shown. Each of the two horizontal boards 61 carries a strip of identical multiway connectors 63. This strip is similar to the strip 30 in the FIG. 2 arrangement and thus will not be described again.

In this interconnecting system the modifications to the known type connectors 75 and 78 described above are sufficient to establish the aforementioned connections between each vertical board and each horizontal board and the previously mentioned connections between the mother board and each of the horizontal and vertical boards to distribute signals to the boards and possibly receive output signals from them. For the purpose of distributing signals from the mother board 67 in FIG. 6 the mother board 67 is also equipped with connectors analogous to those carried by the board 7 shown in FIG. 2. These connectors are used to apply various power supply, clock and test signals, for example, and the circuits or components to which they are connected will not be described again with reference to FIG. 6; they carry the same reference numbers as used in FIG. 2.

The interconnecting system as shown in FIG. 6 makes advantageous provision for interconnecting interface boards and switching circuit boards, especially of the terminal stages, in a switching network connecting bidirectional circuits with cascaded selection stages, for example 2 048 bidirectional circuits.

The aforementioned vertical boards 62 are interface boards each processing two bidirectional circuits. They are each connected by the coaxial contacts 77 that they carry and those 80 of the mother board to these two bidirectional circuits.

In the example under consideration, 16 vertical interface boards are stacked and interconnected to two horizontal boards 61 each of which carries two switching circuits schematically represented at 85. The four switching circuits of the pair of boards implement the function of four 16×16 matrices used symmetrically in the switching network for each of the transmission directions between the bidirectional circuits concerned. The strip of connectors 63 on each horizontal board 61 defines 16 bidirectional input/output connections that are interconnected to the 16 interface boards. On the horizontal boards 61 the switching circuits 85 define, in conjunction with a connection network (not shown) implemented on both boards 61 with connections from one board to the other, possible linking paths between the 32 bidirectional input/output connections formed by the connectors 63 of the two boards and 32 other bidirectional input/output connections divided between eight connectors 86 with four on each board, each comprising eight coaxial contacts. The four connectors 86 on each board 61 are disposed at the edges of the board adjacent that carrying the strip of connectors 63. The 16 interface boards and the two switching boards which are connected to them constitute one terminal module. Eight plugs 87 terminating eight cables 88 each comprising eight coaxial pairs are each used to connect this terminal module to the input/output connections of adjacent selection stage modules.

In a switching network the terminal module is in practise mounted in a shelf simliar to that shown in FIG. 3, for which reason it is now shown here.

To make up a complete switching network for 2 048 bidirectional circuits the equipment is housed in eight racks each of which comprises in precisely the same manner eight terminal module shelves each handling 32 bidirectional circuits and one shelf as shown in FIG. 3 processing 256 bidirectional circuits in the set of eight racks, each of the 64 terminal module shelves being connected to each of the eight shelves as shown in FIG. 3 by a cable comprising eight coaxial pairs, these cables being all the same length. Switching networks for 512 or 1 024 bidirectional circuits may be implemented in an analogous manner to that processing 2 048 circuits, entailing appropriate modification of the circuits carried by the aforementioned switching boards 61.

It will be understood that various changes in the details, materials and arrangements of parts which have been herein described and illustrated in order to explain the nature of the invention may be made by those skilled in the art within the principle and scope of the invention as expressed in the appended claims.

There is claimed:

1. System for interconnecting orthogonally disposed printed circuit boards in respective first and second stacks, comprising first contact members disposed on facing edges of said boards in said two stacks assigned to connections between said boards, a mother board disposed perpendicular to said boards between said two stacks, and second contact members disposed on the same facing edges of said boards as said first contact members and defining with said first contact members a series of first multiway plug-in connectors along the respective edge of each board of said first stack and a series of second multiway plug-in connectors along the respective edge of each board of said second stack, wherein said mother board comprises a distribution network in the form of an array of conductive tracks assigned to distributing signals to said boards and third, connecting contact members and fourth, distribution contact members connected to said distribution network, disposed transversely to said mother board and defining on one side thereof a set of third multiway plug-in connectors having said first connectors plugged into them and on the other side thereof a set of fourth multiway plug-in connectors having said second connectors plugged into them and interconnecting said first contact members of corresponding first and second connectors via said connecting contact members and connecting said second contact members of each board to said distribution network via said distribution contact members.

2. System according to claim 1, wherein there are four contact members assigned to the connections between said orthogonal boards arranged at the corners of a square parallel to said mother board and having, in the case of said first and second connectors, two sides parallel to said boards.

3. System according to claim 2, wherein there are two second contact members in said first and second connectors, in opposed relation to each other in the connector concerned, and fourt distribution contact members in said third and fourth connectors, arranged in opposed pairs in the connector concerned.

4. System according to claim 3, wherein said second contact members are, as seen in cross-section in a plane parallel to said mother board, disposed at the centers of the two sides of said square parallel to the corresponding board.

5. System according to claim 1, wherein each of said connectors comprises an individual collar to protect the contact members of the connector.

6. System according to claim 5, wherein said collars of said first and second connectors comprise means for individually positioning said connectors along the edge of each of said boards receiving them and means for holding said connectors in alignment.

7. Matrix switching network for bidirectional circuits comprising three cascaded selection stages of which the center stage is symmetrical and each of which is defined by a stack of switching circuit boards implementing a system for interconnecting orthogonally disposed printed circuit boards in respective first and second stacks comprising first contact members disposed on facing edges of said boards in said two stacks assigned to connections between said boards, a mother board disposed perpendicular to said boards between said two stacks, and second contact members disposed on the same facing edges of said boards as said first contact members and defining with said first contact members a series of first multiway plug-in connectors along the respective edge of each board of said first stack and a series of second multiway plug-in connectors along the respective edge of each board of said second stack, wherein said mother board comprises a distribution network in the form of an array of conductive tracks assigned to distributing signals to said boards and third, connecting contact members and fourth, distribution contact members connected to said distribution network, disposed transversely to said mother board and defining on one side thereof a set of third multiway plug-in connectors having said first connectors plugged into them and on the other side thereof a set of fourth multiway plug-in connectors having said second connectors plugged into them and interconnecting said first contact members of corresponding first and second connectors via said connecting contact members and connecting said second contact members of each board to said distribution network via said distribution contact members, wherein there are four contact members assigned to the connections between said orthogonal boards arranged at the corners of a square parallel to said mother board and having, in the case of said first and second connectors, two sides parallel to said boards, and wherein each board of said first stack is assigned to said first and third selection stages and carries, in addition to said third multiway connectors, bidirectional input/original coaxial connectors for as many pairs of coaxial cables as there are first multiway connectors on the edges of the respective board adjacent that carrying said first connectors.

8. Switching network according to claim 7, wherein said mother board of said interconnecting system is further equipped with auxiliary connectors connected to said distribution network that it carries and assigned to applying signals to said distribution network.

9. Matrix switching network for bidirectional circuits comprising cascaded selection stages each defined by a stack of switching circuit boards implementing a system for interconnecting orthogonally disposed printed circuit boards in respective first and second stacks comprising first contact members disposed on facing edges of said boards in said two stacks assigned to connections between said boards, a mother board disposed perpendicular to said boards between said two stacks, and second contact members disposed on the same facing edges of said boards as said first contact members and defining with said first contact members a series of first multiway plug-in connectors along the respective edge of each board of said first stack and a series of second multiway plug-in connectors along the respective edge of each board of said second stack, wherein said mother board comprises a distribution network in the form of an array of conductive tracks assigned to distributing signals to said boards and third, connecting contact members and fourth, distribution contact members connected to said distribution network, disposed transversely to said mother board and defining on one side thereof a set of third multiway plug-in connectors having said first connectors plugged into them and on the other side thereof a set of fourth multiway plug-in connectors having said second connectors plugged into them and interconnecting said first contact members of corresponding first and second connectors via said connecting contact members and connecting said second contact members of each board to said distribution network via said distribution contact members, wherein said interconnecting system is employed between switching circuit boards constituting said boards of said first stack and forming part of terminal stages of said network and interface boards constituting said boards of said second stack and processing bidirectional circuits to which are assigned said switching circuit boards constituting said boards of said first stack.

10. Switching network according to claim 9, wherein said multiway connectors carried by said interface boards consist of hybrid connectors with pins and coaxial contacts and said third and fourth multiway connectors carried by said mother board of said interconnecting system consist in complementary hybrid connectors with pins and coaxial contact disposed on the facing edge of said interface boards and having their pins other than those defining said connecting and distribution contact members removed, and wherein said coaxial contacts on said mother board constitute input/output connections for said bidirectional circuits.

11. Switching network according to claim 10, wherein said mother board of said interconnecting system is further equipped with auxiliary connectors connected to said distribution network that it carries and assigned to applying signals to said distribution network.

* * * * *